United States Patent [19]

Shirasaki

[11] 4,218,701
[45] Aug. 19, 1980

[54] PACKAGE FOR AN INTEGRATED CIRCUIT HAVING A CONTAINER WITH SUPPORT BARS

[75] Inventor: Yuzo Shirasaki, Tokorozawa, Japan

[73] Assignee: Citizen Watch Co., Ltd., Tokyo, Japan

[21] Appl. No.: 927,723

[22] Filed: Jul. 24, 1978

[51] Int. Cl.² .............. H01L 23/28; H01L 23/48; H01L 29/44

[52] U.S. Cl. .................................. 357/72; 357/70; 357/74; 357/80; 29/588; 29/578; 174/52 PE; 174/52 S

[58] Field of Search ............... 357/70, 72, 74, 80; 174/52 PE, 52 S; 29/588, 578

[56] References Cited

U.S. PATENT DOCUMENTS

| | | | |
|---|---|---|---|
| 3,568,012 | 3/1971 | Ernst | 357/80 |
| 3,570,115 | 3/1971 | Barnes | 29/588 |
| 3,622,419 | 11/1971 | London | 357/72 |
| 3,745,648 | 7/1973 | Wiesner | 357/74 |
| 3,984,739 | 10/1976 | Mochizuki et al. | 357/72 |
| 4,143,456 | 3/1979 | Inoue | 357/72 |
| 4,143,508 | 3/1979 | Ohno | 357/70 |

OTHER PUBLICATIONS

IBM Technical Disclosure Bulletin; Low-Cost, Large-Scale Integration Single Chip Module Package; vol. 18, No. 11, Apr. 1976, by Jawela, pp. 3698-3699.

Primary Examiner—Andrew J. James
Attorney, Agent, or Firm—Birch, Stewart, Kolasch & Birch

[57] ABSTRACT

An integrated circuit package for an electronic timepiece comprising an integrated circuit holder, a circuit board having an aperture therein and an integrated circuit chip is disclosed. The integrated circuit plastic holder comprises a container, a frame surrounding the container, and bars connecting the container with the frame. The container component is inserted into the aperture of the circuit board. The integrated circuit chip is placed in the container component. Electrodes are provided on the chip and circuit board and wire-bonded to complete the electrical circuit and a synthetic resin potting compound introduced into the circuit holder so as to incase the integrated circuit chip, circuit board, and respective electrode connections within the confines of the framework surrounding the container. Thus, the frame acts as a weir for defining the spreading range of the resin.

4 Claims, 4 Drawing Figures

PACKAGE FOR AN INTEGRATED CIRCUIT HAVING A CONTAINER WITH SUPPORT BARS

BACKGROUND OF THE INVENTION

The present invention relates to an integrated circuit package structure and more particularly to a circuit package compacted in a small space for electronic timepieces and the like.

In a conventional method for packaging an integrated circuit in a small space, an integrated circuit chip is mounted on a plastic or ceramic circuit board and then the integrated circuit chip is the coated with plastic such as synthetic resin. Thus, thickness of the integrated circuit package structure is sum of thicknesses of the circuit board, integrated circuit chip and the plastic coating, which is relatively thick and hence which is a hindrance to making a thin electronic watch. Further, in such a conventional structure, a frame is secured on the circuit board with an adhesive for preventing the synthetic resin from spreading on the circuit board during the curing of the plastic. It will be seen that the adhesion operation of the frame results in increase of the working stage and of the cost of the packaging.

It is an object of the present invention to provide an integrated circuit package which will overcome the above noted disadvantages. It is another object of the present invention to provide a method for preparing a integrated circuit package comprising an integrated circuit chip electrically connected to a circuit board.

SUMMARY OF THE INVENTION

It is an object of the present invention to provide an integrated circuit package which may be formed expediently into a thin high density structure.

These and other objects and features of the present invention will become more fully apparent from the following detailed description in conjunction with the accompanying drawings. It should be understood, however, that the detailed description and accompanying drawings, while indicating preferred embodiments of the invention, are given by way of illustration only, since various changes and modifications within the spirit and scope of the invention will become apparent to those skilled in the art. Any such changes and modifications should be considered to be included within the scope of this invention.

In accordance with the present invention, the integrated circuit package comprises an integrated circuit holder moulded from plastic such as synthetic resin, which comprises an integrated circuit container, a frame surrounding the container, and bars connecting the container with the frame, and a circuit board having an aperture. The container is provided to project from the underside of the frame so as to engage the aperture of the circuit board. An integrated circuit chip is secured in the container, terminal electrodes of the chip are wire-bonded with lead electrodes provided on the circuit board, and plastic is potted in the container to coat the integrated circuit chip.

DESCRIPTION OF THE PREFERRED EMBODIMENTS

Figure 1:
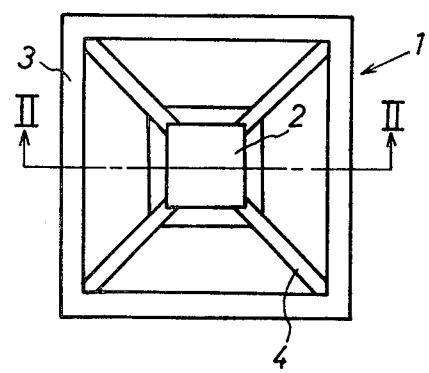
FIG. 1 is a plan view of an integrated circuit holder.
Figure 2:
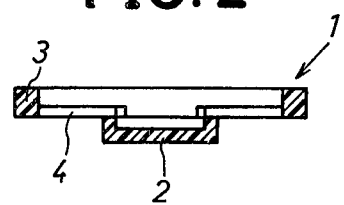
FIG. 2 is a sectional view taken along the line II—II of FIG. 1.

Referring to the drawings, particularly to FIGS. 1 and 2, an integrated circuit holder 1 which is moulded from plastic, comprises a square container 2 of which space has a height nearly equal to a height of an integrated circuit chip to be packed, a square frame 3 surrounding the container and bars 4 for connecting the container 2 with the frame 3 at every corner. The frame 3 has a sufficient height in cross section for preventing a plastic potted therein from spreading on a circuit board hereinafter described. The underside of the frame 3 and the same of each bar 4 are flush with each other and the container 2 is provided on the underside of the connecting bars 4 as shown in FIG. 2, so that the container projects from the underside of the frame 3.

Figure 3:
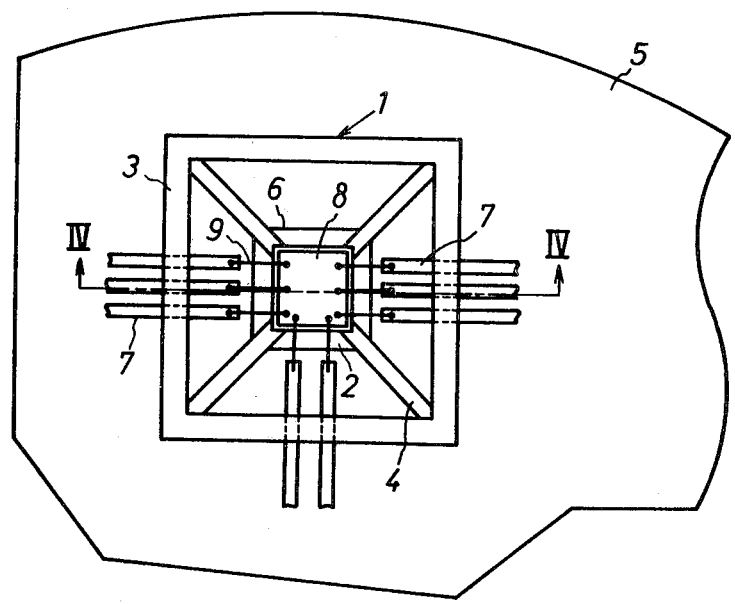
FIG. 3 is a plan view showing a circuit board made in accordance with the present invention for an electronic watch.
Figure 4:
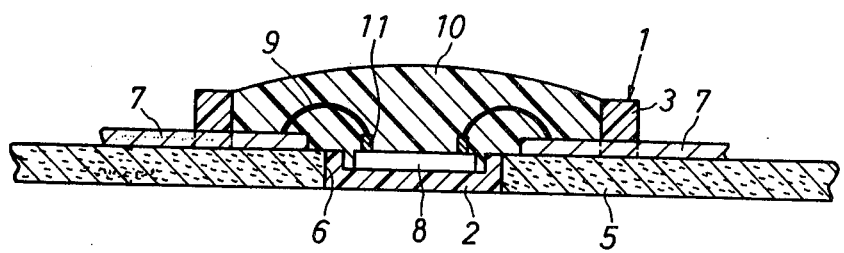
FIG. 4 is an enlarged sectional view taken along the line IV—IV of FIG. 3.

Referring to FIGS. 3 and 4, a circuit board 5 for an electronic watch has an aperture 6 formed by punching work. On the circuit board 5, lead electrodes 7 are provided around the aperture 6.

In packaging an integrated circuit, the holder 1 is engaged with the circuit board 5 by pressure fitting the container 2 into the aperture 6, where the undersides of the frame portion 3 and connecting bars 4 are pressed against the surface of the circuit board. It should be noted that the upper surface of the container 2 is coplanar with the surface of the circuit board 5. Then, an integrated circuit chip 8 is secured in the container 2 with adhesive. Terminal electrodes 11 of the integrated circuit chip 8 and the lead electrodes 7 on the circuit board 5 are wire-bonded by gold wires 9, respectively. It will be seen that the wire-bonding working is not obstructed by bars 4, since the bars are positioned to avoid the lead electrodes 7. Thereafter, synthetic resin 10 is potted in the holder 1 for packaging the integrated circuit chip. The frame 3 acts as a weir for preventing the resin from spreading on the circuit board 5 to define the spreading range of the resin.

It should be noted that the integrated circuit chip 8 may be embedded in the circuit board within the thickness thereof, because the container 2 is engaged with the aperture of the circuit board and the integrated circuit chip 8 is secured in the container. Further, the wire-bonding characteristic is highly improved, since each terminal electrode of the integral circuit chip is positioned in nearly the same plane with the lead electrode 7 on the circuit board 5. It will be further understood that the height of the wire 9 in the form of a round arch may be decreased, because there are no obstacles between the terminal electrode of the integrated circuit chip and the lead electrode 7, whereby the height of the potting resin 10 may also be decreased. Thus, it is possible to provide an integrated circuit package having a small thickness and a closely compacted structure. Further, since the container 2 is integrated with the frame portion 3, operations for manufacturing the container and for mounting it on the circuit board may be performed at the same time with the operations for manufacturing the frame and for securing to the board, respectively. Thus, it is possible to decrease the number of stages for manufacturing the integrated circuit.

The invention being thus described, it will be obvious that the same may be varied in many ways. Such variations are not to be regarded as a departure from the spirit and scope of the invention and all such modifications as would be obvious to one skilled in the art are intended to be included within the scope of the following claims.

What is claimed is:

1. An integrated circuit package structure comprising in combination a circuit board having an aperture therein, an integrated circuit holder secured to said circuit board comprising an integrated circuit container, a frame surrounding said container, and bars for connecting said container to said frame, said container being inserted into the aperture of said circuit board such that the undersides of said frame and said bars are pressed against the surface of said circuit board and the upper surface of said container is coplanar with the surface of said circuit board, an integrated circuit chip provided in said container having terminal electrodes wire-bonded to corresponding lead electrodes on said circuit board and a plastic potting compound confined within said frame coating the electrically connected integrated circuit chip.

2. An integrated circuit package structure in accordance with claim 1 in which each terminal electrode of said integrated circuit chip is in the nearly same plane with each of said lead electrodes.

3. An integrated circuit package structure in accordance with claim 1 in which each of said bars is positioned so as not to obstruct the wire-bonding working for said terminal electrodes and lead electrodes.

4. The integrated circuit package structure as disclosed in claim 1, wherein said integrated circuit holder is molded from plastic.

* * * * *